(12) United States Patent
Jain et al.

(10) Patent No.: US 12,547,194 B2
(45) Date of Patent: Feb. 10, 2026

(54) COMMON BIAS CONTROL FOR DEVICES HAVING UNCORRELATED POWER SUPPLIES

(71) Applicant: GlobalFoundries U.S. Inc., Malta, NY (US)

(72) Inventors: Navneet K. Jain, Milpitas, CA (US); Arif A. Siddiqi, Milpitas, CA (US); Mahbub Rashed, Cupertino, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 64 days.

(21) Appl. No.: 18/773,820

(22) Filed: Jul. 16, 2024

(65) Prior Publication Data

US 2026/0023402 A1 Jan. 22, 2026

(51) Int. Cl.
*G05F 1/46* (2006.01)
*H03K 3/03* (2006.01)

(52) U.S. Cl.
CPC ............. *G05F 1/46* (2013.01); *H03K 3/0315* (2013.01)

(58) Field of Classification Search
None
See application file for complete search history.

(56) References Cited

U.S. PATENT DOCUMENTS

| | | | | |
|---|---|---|---|---|
| 5,808,505 | A * | 9/1998 | Tsukada | H03K 3/354 327/535 |
| 6,535,435 | B2 * | 3/2003 | Tanaka | G11C 5/147 365/175 |
| 7,911,261 | B1 * | 3/2011 | Shamarao | G05F 3/08 327/535 |
| 9,001,572 | B2 | 4/2015 | Choi et al. | |
| 10,359,793 | B2 * | 7/2019 | Kim | H03K 3/011 |
| 10,468,095 | B2 | 11/2019 | Jain et al. | |

* cited by examiner

*Primary Examiner* — Jeffrey S Zweizig
(74) *Attorney, Agent, or Firm* — David Cain; Hoffman Warnick LLC

(57) ABSTRACT

A device and method for generating a common bias for a device component having a first circuit powered by a first power supply and a second circuit powered by a second power supply. A method includes: arranging a circuit path in a ring oscillator to replicate a logic depth of both the first circuit and the second circuit, wherein the ring oscillator is controlled by the common bias and a first portion of the circuit path is powered by the first power supply and a second portion of the circuit path is powered by the second power supply; outputting an oscillating signal from the ring oscillator; computing common bias voltages based on the oscillating signal; and applying the common bias voltages to the device component.

20 Claims, 4 Drawing Sheets

COMMON BIAS CONTROL FOR DEVICES HAVING UNCORRELATED POWER SUPPLIES

BACKGROUND

The present disclosure relates generally to bias control in semiconductor devices, and, more particularly, to common bias control for device components having uncorrelated power supplies.

Semiconductor components, including memory circuits, logic circuits, register file circuits, etc., may be implemented with two or more power supplies (e.g., array and periphery) that power two or more different circuits within the same component. In many cases, the two power supplies are not necessarily correlated. While the voltages of the two power supplies ideally should be identical, they often differ because, e.g., they use different supplies. Accordingly, in such cases, there are two different circuit domains that operate with two different, uncorrelated power supplies.

SUMMARY

All aspects, examples and features mentioned below can be combined in any technically possible way.

An aspect of the disclosure provides a semiconductor device that includes: a bias generator that generates a common bias including a p-well voltage and an n-well voltage; a device component controlled by the common bias, wherein the device component includes a first circuit powered by a first power supply and a second circuit powered by a second power supply; and a control circuit that includes: a ring oscillator controlled by the common bias and coupled to the first power supply and the second power supply, and wherein an output of the ring oscillator comprises an oscillating signal, and control logic for selecting the p-well voltage and the n-well voltage for the bias generator based on the output of the ring oscillator. In certain additional aspects, the ring oscillator is programmable to replicate a logic depth of both the first circuit and the second circuit.

Another aspect of the disclosure provides a method, comprising: arranging a circuit path in a ring oscillator to replicate a logic depth of both a first circuit and a second circuit in a device component, wherein the first circuit is powered by a first power supply and the second circuit is powered by a second power supply, wherein a first portion of the circuit path is powered by the first power supply and a second portion of the circuit path is powered by the second power supply, and wherein both the ring oscillator and device component are biasable by a common bias; outputting an oscillating signal from the ring oscillator; computing the common bias voltages based on the oscillating signal; and applying the common bias voltages to the device component.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
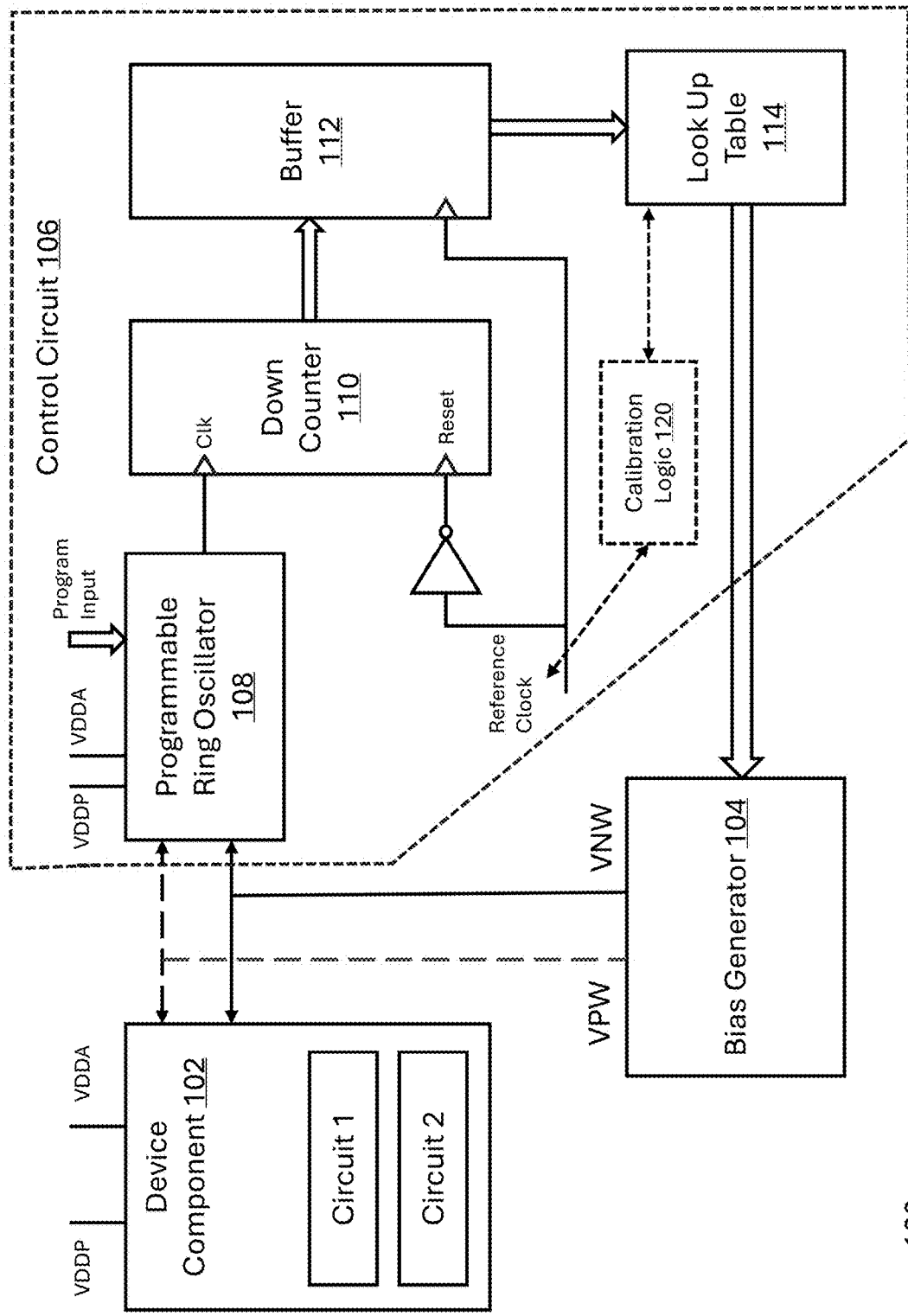
FIG. 1 shows a block diagram of a semiconductor device having a bias generator and monitoring circuit, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of this disclosure provide a control circuit for adaptively controlling a bias generator. As noted, device components, e.g., memory circuits, logic circuits, register file circuits, etc., may be implemented with two or more power supplies that power two or more different circuits within the same device component. In many cases, the two power supplies are not correlated.

Furthermore, in certain types of semiconductor devices, such as fully depleted silicon on insulator (FDSOI) devices, the performance of an associated circuit can be optimized by altering the body or back gate bias (which controls the threshold voltage of the components on the chip). Back gate bias, which includes a pair of bias voltages, one for the n-well (i.e., NFET) and one for the p-well (PFET), is common across each device component. In cases where there are two uncorrelated circuits in a device component, both circuits operate in a common bias domain, but in different voltage domains. Accordingly, whatever bias is applied to the first circuit is also applied to the second circuit, which may be beneficial for one circuit but not the other. The present approach provides a system and method for adaptively optimizing the body bias in such cases to improve overall performance.

FIG. 1 depicts a portion of an illustrative semiconductor device 100 that is biasable using a generated common bias (also referred hereafter as "bias") from a bias generator 104. Device 100 includes a device component 102 that includes a first circuit (Circuit 1) powered by a first supply voltage VDDP and a second circuit (Circuit 2) powered by a second voltage supply VDDA. In this example, device component 102 may comprise a memory device having two uncorrelated circuits powered by periphery and array voltages sources. However, it is understood that device component 102 may comprise any type of component having multiple uncorrelated circuits separately powered by different power supplies. As noted, the common bias applied to the first circuit is also applied to the second circuit, which may be beneficial for one circuit but not the other, resulting in an overall low performance.

To address this issue and generate an optimized bias to maximize performance, control circuit 106 is provided that adaptively controls the common bias, i.e., the p-well (VPW) and n-well (VNW) voltage values generated by bias generator 104 to control device component 102. Control circuit 106 includes a programmable ring oscillator 108 and control logic, which in this embodiment includes a down counter 110, a buffer 112, and a look up table 114. Programmable ring oscillator 108 is likewise controlled by the common bias generated by bias generator 104 and is programmable to replicate a "logic depth" of both the first circuit and the second circuit in device component 102. Logic depth is generally defined as an amount of time required by a given circuit to complete a task, e.g., retrieve data from memory, perform a calculation, etc. The output of the ring oscillator 108 accordingly comprises an oscillating signal that replicates an overall operational speed (i.e., frequency) of the device component 102.

In the example shown in FIG. 1, the output signal of ring oscillator 108 is fed to down counter 110 that is triggered by a reference clock. Down counter 110 may for example comprise an n-bit ripple down counter that counts down from a given value (e.g., 256) to zero for a duration (e.g., a pulse width) of the reference clock. In this case, the lower the counter value, the higher the frequency (and performance). The output of down counter 110 (i.e., a counter value) is then temporarily stored in buffer 112, which may for example comprise and n-bit D flip-flop logic structure. The value stored in buffer 112 is in turn used by look-up table 114 to retrieve p-well and n-well voltage values (VPW and VNW) for bias generator 104. Bias generator 104 receives the information from the look up table 114 and outputs the bias values (VPW and VNW) to device component 102 and to the programmable ring oscillator 108. The process thereafter repeats to dynamically and adaptively identify an ideal bias condition of VPW and VNW that achieves an optimal target frequency.

It is understood that the control logic used to process the output of ring oscillator 108 described with respect to FIG. 1 is not intended to be limiting and other control logic could be utilized. For example, rather than using a down counter 110, an up-counter that increases could be utilized; rather than using a look-up table 114, an algorithm that computationally calculates bias values based on a frequency or counter value could be utilized; etc.

Figure 2:
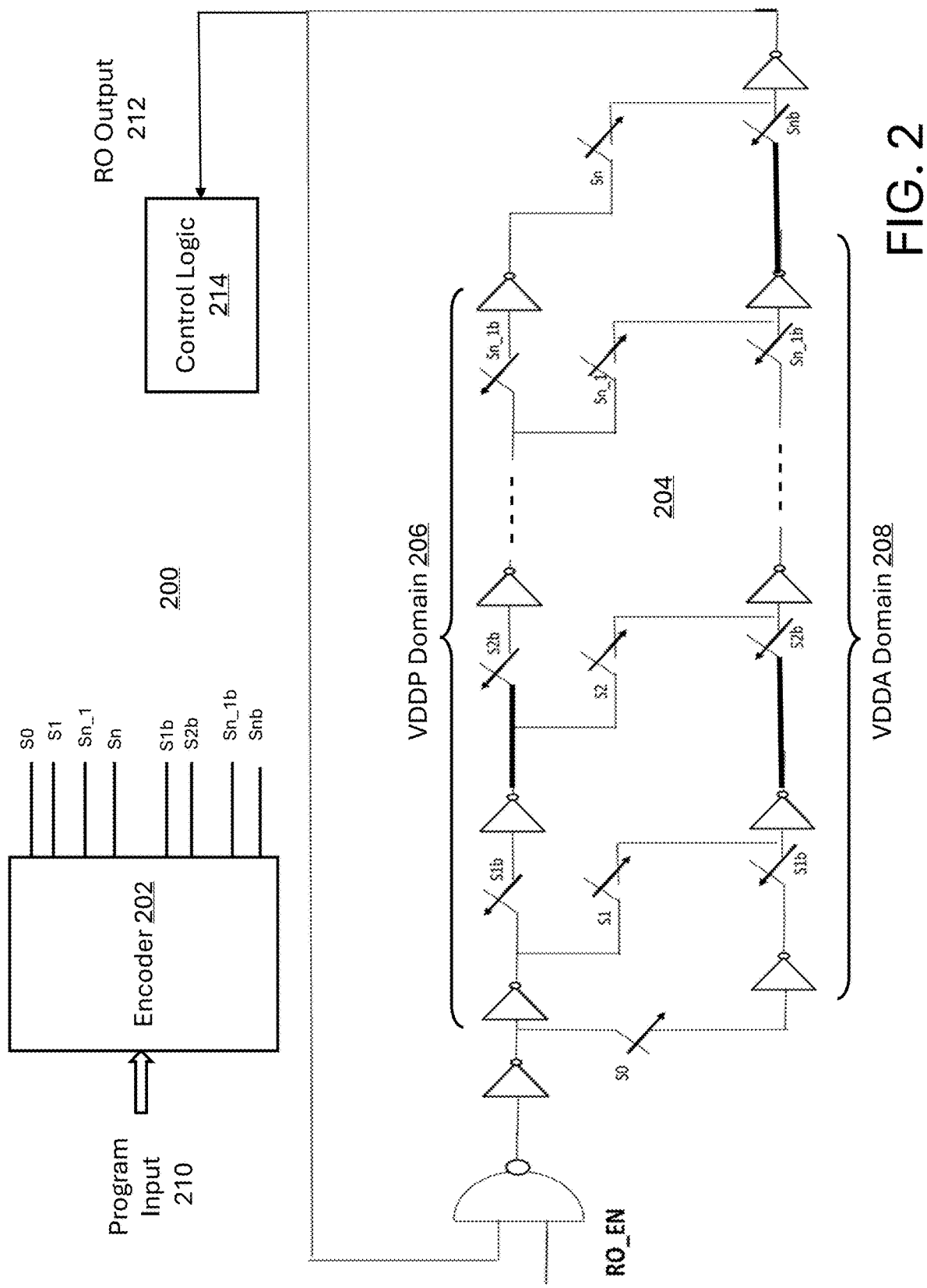
FIG. 2 shows a schematic view of programmable ring oscillator, according to embodiments of the disclosure.

FIG. 2 depicts an illustrative embodiment of a programmable ring oscillator 200, which generally includes an encoder 202 for receiving and decoding a program input 210 and an inverter circuit 204. Inverter circuit 204 includes a first set of inverters operating in a first voltage (VDDP) domain 206 and a second set of inverters operating in a second (VDDA) domain 208. In certain cases, each inverter in the VDDP domain will include a P-type field effect transistor (PFET) and an N-type field effect transistor (NFET) connected in series between a VDDP rail and ground; whereas each inverter in the VDDA domain will include a PFET and an NFET connected in series between a VDDA rail and ground. Additionally, in the case for example of a semiconductor device with super low threshold voltage (SLVT) or low threshold voltage (LVT) PFETs and NFET, within ring oscillator 200 and regardless of the voltage domains, the PFETs of the inverters can be above Pwell(s) so as to be back biased with VPW from the bias generator 104, whereas the NFETs of the inverters can be above Nwell(s) so as to be back biased with VNW. Based on the program input 210 (e.g., an n-bit value), encoder 202 will output a set of signals to arrange a subset of inverters from each domain 206, 208 in a series circuit configuration. The ring oscillator 200 is enabled by an enable signal RO_EN and a NAND gate, and once running, ring oscillator output 212 is provided to control logic 214, e.g., as described in FIG. 1.

The number of inverters used from each domain 206, 208 in the circuit arrangement is dependent on the logic depth of the two circuits in device component 102 (FIG. 1). Thus, for example, if the total logic depth of a critical memory path in device component 102 is defined as D, some percentage, e.g., x %, would be allocated to the VDDP domain 206 and D-x % would be allocated to the VDDA domain 208. Based on the allocation, a corresponding program input 210 is provided to encoder 202, which then automatically configures the inverter circuit 204 to use a certain number of inverters p from the VDDP domain 206 and a certain number of inverters q from the VDDA domain 208 (arranged in a series circuit) to replicate the logic depth of both circuits in the device component 102. The result is a weighted ring oscillator that accounts for both circuits in device component 102. In a typical scenario, the provider or manufacturer of a specific device component 102 would determine the program input 210 ahead of time to achieve replication, and provide the input 210, e.g., in a specification sheet or the like. The party implementing device 100 may simply then hardcode the program input 210 when setting up the device.

It is understood that programmable ring oscillator 200 and inverter circuit 204 shown in FIG. 2 are not intended to be limiting. Any system capable of replicating the logic depth of component circuits operating in different voltage domains could be utilized.

Referring again to FIG. 1, values in look-up table 114 may be determined in any manner, e.g., based on prior testing, expert knowledge, machine learning, etc. In one illustrative embodiment, down counter 110 may be configured to count down from 256 and 0 during a pulse width of the reference clock and output a counter value. In certain embodiments, the counter value is calibrated to be at a target reference value, e.g., 64, for a desired performance of the ring oscillator 108. If the counter value is above the reference value, it implies the ring oscillator frequency is lower than desired, and therefore the device component 102 is running at lower frequency than desired. This is due to the uncorrelated power supplies (VDDP, VDDA). If the counter value is equal to the reference value, this implies that the device component is running at the ideal frequency with the ideal bias.

If the ring oscillator 108 of FIG. 1 is running at a lower than desired frequency, the reduction in the frequency could be due to one or both power supplies VDDP, VDDA operating below their expected (i.e., nominal) voltage, e.g., 0.8 volts. To compensate for the reduced frequency, the bias voltages (VPW, VNW) can be adjusted to reduce the threshold voltages (VTs) of the PFETs and the NFETs based on the count value. For example, VPW could range from 0.0V to a maximum negative voltage level and VNW could range from 0.0V to a maximum positive voltage level. Given the count value, the negative voltage level of VPW could be increased reducing the VT of the PFETs and/or the positive voltage level of VNW could be increased reducing the VT of the NFETs. In particular, the count value, which is saved in buffer 112, is applied to look-up table 114 to ascertain bias voltages that will be applied by bias generator 104 to increase the ring oscillator 108 frequency. The increase in bias voltages is also applied to device component 102 to increase its frequency. The process of monitoring the ring oscillator frequency and adjusting the bias voltages continues until the counter value converges to the reference value, e.g., 64.

If both VDDA and VDDP voltages are larger than the expected voltages, then the ring oscillator frequency will be adequately high and count values from the down counter 110 will be less than the reference value (e.g., less than 64). In this scenario, the look-up table 114 will drive the bias voltages VPW and VNW to zero, i.e., a zero-bias condition.

If both VDDA and VDDP voltages are smaller than the expected voltages, then the ring oscillator frequency will be slower than desired and count values will be greater than the reference count (e.g., greater than 64). In this scenario, both bias voltages VPW and VNW will be increased, which will drive the count value down to the reference value (e.g., 64).

If one of the voltages (VDDA or VDDP) is smaller than expected and the other voltage is at the expected voltage or even larger, then the ring oscillator frequency may be larger or smaller than the reference value. For example, in the case where the reference value is 64,
- if the count value is greater than 64, then both bias voltages will eventually be increased up to levels so that the count value converges to 64, and
- if the count value is less than 64, both bias voltages will be reduced to zero bias values.

Note that when VDDA and VDDP voltages are such that the ring oscillator 108 is running at a relatively higher frequency, i.e., the count value is less than 64, the count value might remain below 64 even after the bias voltages VPW and VNW are at zero bias. In such situations, a flag signal can be generated for continued monitoring and potential recalibration.

As shown in FIG. 1, calibration logic 120 may be deployed to ensure that the reference value (e.g., 64) accurately reflects the ideal setting. One way to achieve this is to calibrate the pulse width of the reference clock based on the supply voltage ranges of the two supply voltages (VDDP and VDDA). If the pulse width is too large, the down counter 110 will repeatedly output a count value below the reference value. In this case, the pulse width of the reference clock can be recalibrated, e.g., shortened using calibration logic 120 (FIG. 1). In other cases, the reference value can be adjusted upward or downward to ensure that it provides an ideal ring oscillator frequency. In this case, the look-up table 114 may need to be recalibrated with the adjusted reference value to provide the correct bias voltage values.

Figure 3:
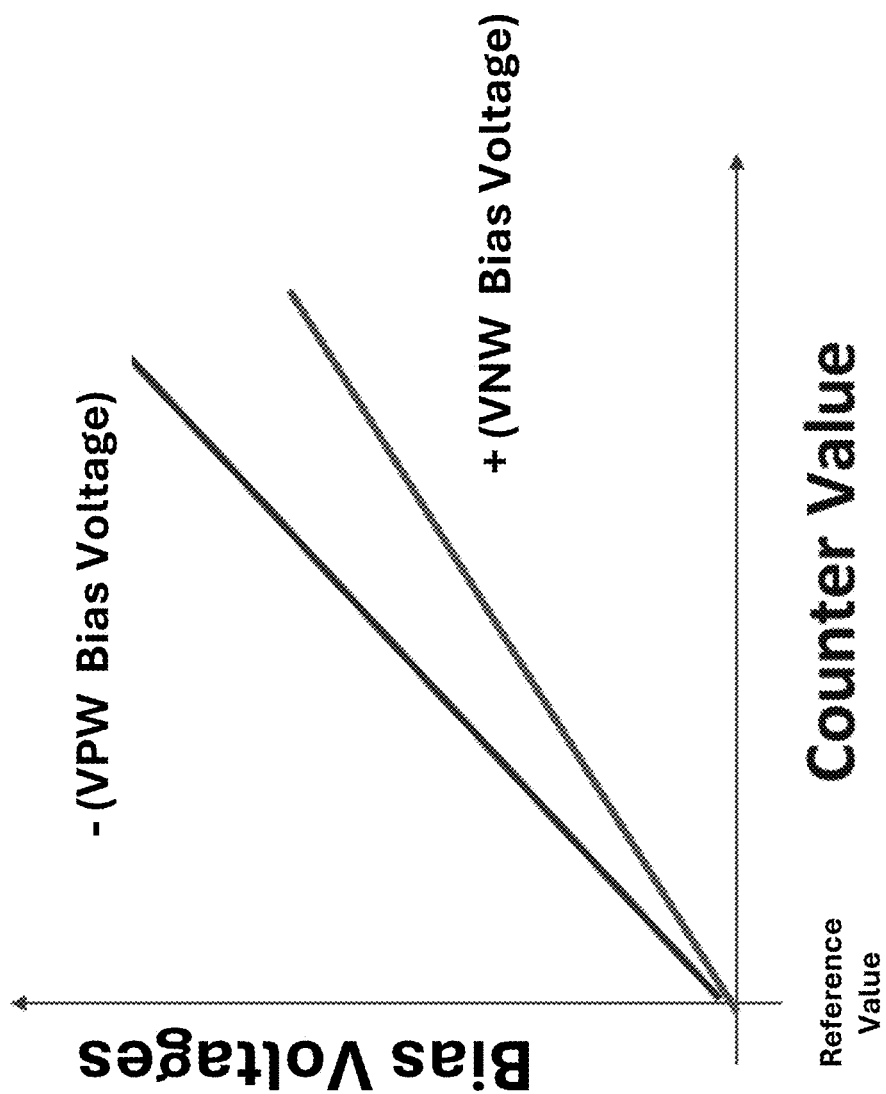
FIG. 3 shows a hypothetical graph for a table look-up, according to embodiments of the disclosure.

FIG. 3 depicts a hypothetical graph (e.g., determined based on prior experimentation) that could be utilized to set the VPW and VNW look-up table 114 values. In the example graph, as the counter value increases, the (negative) VPW voltage increases more than the (positive) VNW voltage to achieve an optimal setting.

Note that the embodiments of FIGS. 1-3 describe a device and circuit in which forward bias is applied to adjust the frequency, i.e., increasing the bias voltages in devices such as low or super-low threshold voltage transistors (LVT and SLVT) increases the frequency of the system. A similar circuit could likewise be implemented to utilize and apply a reverse bias, i.e., increasing the bias voltages for devices such as regular, high, or ultra-high transistors (RVT, HVT, and UHVT) reduces the frequency of the system.

Figure 4:
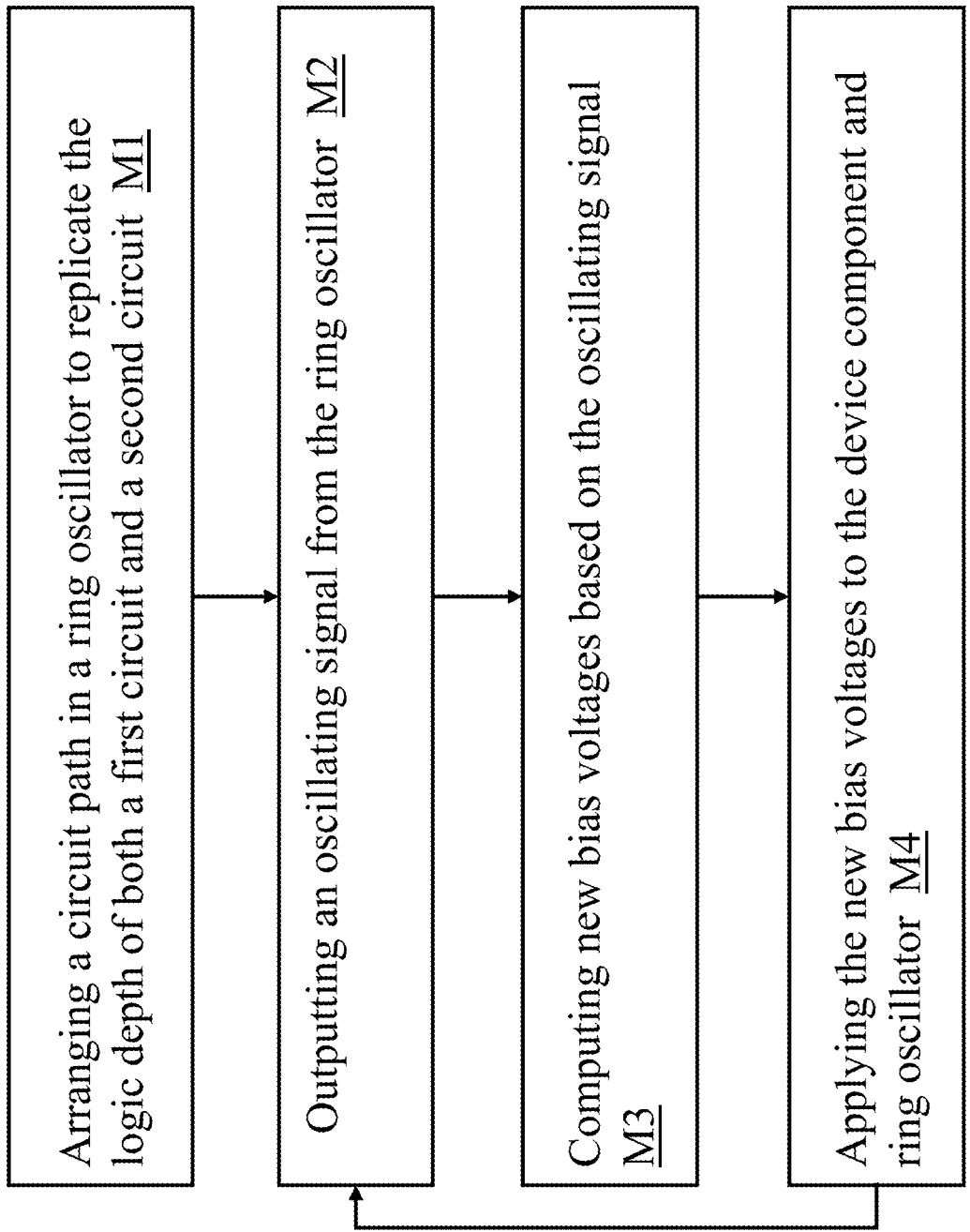
FIG. 4 shows a flow diagram of method according to embodiments of the disclosure.

FIG. 4 depicts a flow chart of a method of generating bias voltages for a device component 102 (FIG. 1) having a first circuit powered by a first power supply and a second circuit powered by a second power supply. At M1, a circuit path is arranged in ring oscillator 108 to replicate the logic depth of both the first circuit and the second circuit in device component 102. The ring oscillator 108 is controlled by the bias voltages VPW and VNW and a first portion of the circuit path is powered by the first power supply (e.g., VDDP) and a second portion of the circuit path is powered by the second power supply (e.g., VDDA). Next, at M2, an oscillating signal is output from the ring oscillator 108 and at M3 new bias voltages VPW and VNW are computed based on the oscillating signal. At M4, the new bias voltages are applied to device component 102 and ring oscillator 108, and the process loops back to M2.

A weighted ring oscillator is accordingly provided with multiple voltage domains for replicating two or more circuits having uncorrelated voltages and a common body bias. Frequency of the oscillating signal from the ring oscillator is monitored and bias control is obtained based on the frequency. A frequency counter value and look-up table may be used to determine voltages to bias a device component.

The terminology used herein is for the purpose of describing particular embodiments only and is not intended to be limiting of the disclosure. As used herein, reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed. It will be further understood that the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not. It will be further understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A semiconductor device, comprising:
   a bias generator that generates a common bias including a p-well voltage and an n-well voltage;
   a device component controlled by the common bias, wherein the device component includes a first circuit powered by a first power supply and a second circuit powered by a second power supply; and
   a control circuit that includes:
      a ring oscillator controlled by the common bias and coupled to the first power supply and the second power supply, wherein an output of the ring oscillator comprises an oscillating signal, and
      control logic for selecting the p-well voltage and the n-well voltage for the bias generator based on the output of the ring oscillator.

2. The semiconductor device of claim 1, wherein the ring oscillator is programmable to replicate a logic depth of both the first circuit and the second circuit.

3. The semiconductor device of claim 1, wherein the device component includes one of a memory circuit, a register file circuit, or a logic circuit, and wherein the first power supply and second power supply are uncorrelated.

4. The semiconductor device of claim 1, wherein ring oscillator includes a first plurality of selectable inverters operating in a first power supply domain and a second plurality of selectable inverters operating in a second power supply domain.

5. The semiconductor device of claim 1, wherein the control logic includes a counter that processes the output from the ring oscillator relative to a reference clock and generates a counter value.

6. The semiconductor device of claim 5, wherein the control logic further includes a look-up table that determines the p-well voltage and the n-well voltage for the bias generator based on the counter value.

7. The semiconductor device of claim 5, wherein a pulse width of the reference clock is adjustable based on a supply voltage range of the first power supply and second power supply.

8. The semiconductor device of claim 5, wherein the counter includes a down counter that outputs a target reference value when an ideal operational speed is achieved.

9. The semiconductor device of claim 1, wherein the ring oscillator includes a one hot encoder that controls a set of switches in the ring oscillator based on a program input.

10. The semiconductor device of claim 1, wherein the first power supply comprises a periphery voltage and the second power supply comprises an array voltage.

11. A method, comprising:
   arranging a circuit path in a ring oscillator to replicate a logic depth of both a first circuit and a second circuit in a device component, wherein the first circuit is powered by a first power supply and the second circuit is powered by a second power supply, wherein a first portion of the circuit path is powered by the first power supply and a second portion of the circuit path is powered by the second power supply, and wherein both the ring oscillator and device component are biasable by a common bias;
   outputting an oscillating signal from the ring oscillator;
   computing common bias voltages based on the oscillating signal; and
   applying the common bias voltages to the device component.

12. The method of claim 11, wherein the device component includes one of a memory circuit, a register file circuit, or a logic circuit.

13. The method of claim 11, wherein the first power supply and second power supply are uncorrelated.

14. The method of claim 11, wherein ring oscillator includes a first plurality of selectable inverters operating in a first power supply domain and a second plurality of selectable inverters operating in a second power supply domain.

15. The method of claim 11, wherein computing the common bias voltages includes generating a counter value from the oscillating signal relative to a reference clock.

16. The method of claim 15, wherein computing the common bias voltages further includes using a look-up table to determine a p-well voltage and an n-well voltage based on the counter value.

17. The method of claim 15, wherein a pulse width of the reference clock is adjustable based on a supply voltage range of the first power supply and second power supply.

18. The method of claim 15, wherein the counter value is determined from a down counter that outputs a target reference value when an ideal operational speed is achieved.

19. The method of claim 11, wherein arranging the circuit path in the ring oscillator includes receiving a program input into an encoder that controls a set of switches in the ring oscillator.

20. The method of claim 11, wherein the first power supply comprises a periphery voltage and the second power supply comprises an array voltage.

\* \* \* \* \*